United States Patent [19]

Hartig et al.

[11] Patent Number: 5,427,665
[45] Date of Patent: Jun. 27, 1995

[54] PROCESS AND APPARATUS FOR REACTIVE COATING OF A SUBSTRATE

[75] Inventors: Klaus Hartig, Ronneburg; Joachim Szczyrbowski, Goldbach, both of Germany

[73] Assignee: Leybold Aktiengesellschaft, Hanau, Germany

[21] Appl. No.: 728,562

[22] Filed: Jul. 11, 1991

[30] Foreign Application Priority Data

Jul. 11, 1990 [DE] Germany ............ 40 22 101.6
Aug. 9, 1990 [DE] Germany ............ 40 25 231.0
Dec. 4, 1990 [DE] Germany ............ 40 38 577.9

[51] Int. Cl.⁶ ........................................ C23C 14/34
[52] U.S. Cl. ..................... 204/192.12; 204/192.15;
204/192.23; 204/298.07; 204/298.11;
204/298.14; 204/298.19; 204/298.2;
204/298.21; 204/298.22
[58] Field of Search .......... 204/298.11, 298.12,
204/298.14, 298.19, 298.2, 298.21, 298.22,
298.07, 192.12, 192.23, 192.15

[56] References Cited

U.S. PATENT DOCUMENTS

| | | | |
|---|---|---|---|
| 4,275,126 | 6/1981 | Bergmann et al. | 204/298.2 X |
| 4,315,960 | 2/1982 | Ohji et al. | 204/298.11 X |
| 4,436,602 | 3/1984 | Harra et al. | 204/298.11 X |
| 4,443,318 | 4/1984 | McKelvey | 204/298.22 X |
| 4,444,635 | 4/1984 | Kobayashi et al. | 204/298.2 X |
| 4,466,877 | 8/1984 | McKelvey | 204/298.22 X |
| 4,606,802 | 8/1986 | Kobayashi et al. | 204/298.19 X |
| 4,814,056 | 3/1989 | Welty | 204/298.11 |
| 4,865,710 | 9/1989 | Aaron et al. | 204/298.2 |
| 1,927,513 | 5/1990 | Schultheiss et al. | 204/298.11 X |
| 4,931,169 | 6/1990 | Scherer et al. | 204/298.11 |
| 4,946,576 | 8/1990 | Dietrich et al. | 204/298.14 X |
| 5,047,131 | 9/1991 | Wolfe et al. | 204/298.22 X |

FOREIGN PATENT DOCUMENTS

| | | | |
|---|---|---|---|
| 2707144 | 8/1977 | Germany | 204/298.2 |
| 61-243171 | of 1986 | Japan . | |
| 0235560 | 10/1986 | Japan | 204/298.2 |
| 0282262 | 11/1988 | Japan | 204/298.2 |
| 1-255668 | of 1989 | Japan . | |
| 0215975 | 8/1989 | Japan | 204/298.21 |
| 3240953 | 10/1991 | Japan | 204/298.2 |

*Primary Examiner*—Nam Nguyen
*Attorney, Agent, or Firm*—Felfe & Lynch

[57] ABSTRACT

An apparatus for the reactive coating of a substrate 1, with silicon dioxide ($SiO_2$) for example, comprises a power source 10, 37 connected to an electrode 5 which is disposed in an evacuable coating chamber 15, 15a and interacts with a target 3 which is sputtered and the sputtered particles of which are deposited on the substrate 1, wherein argon and oxygen, for example, are supplied to the coating chamber 15, 15a. The target to be sputtered is composed of several parts, for example. A center part 3a of the target 3 opposite the substrate 1 is made of silicon (Si) and the part 3b surrounding this center portion is made of zinc (Sn), for example. Provision is made for a diaphragm 24 between the substrate 1 on the one hand, and the target 3, on the other hand. The shape of the magnetic field of the electrode 5 during the sputtering generates a sputtering of the more reactive target material 3a in the oxidic mode and of the less reactive target material 3b in the metallic mode.

13 Claims, 5 Drawing Sheets

PROCESS AND APPARATUS FOR REACTIVE COATING OF A SUBSTRATE

BACKGROUND OF THE INVENTION

The invention relates to a process and an apparatus including a power source connected to an electrode disposed in an evacuable coating chamber for reactively coating a substrate, for example with silicon dioxide ($SiO_2$). This electrode is electrically connected to a target to be sputtered and the sputtered particles are deposited on the substrate with a process gas being supplied to the coating chamber.

In known processes for coating substrates by means of cathode sputtering and materials having a high affinity for the reactive gas, the problem arises that in addition to the substrate itself, other parts of the apparatus, like the inner wall of the process chamber or parts of diaphragms, are also coated with materials that have little or no electrical conductivity. This requires a frequent change of process parameters in the course of one single coating process or even a frequent interruption of the process as well as a frequent cleaning or replacing of parts of the apparatus.

SUMMARY OF THE INVENTION

The present invention hence addresses the task of creating an apparatus and a process for sputtering materials having a high affinity for the reactive gas, which permits a uniform and stable process and renders cleaning parts of the apparatus superfluous. Conventional and already existing apparatus and units are still suitable for this purpose, and their upgrading does not involve essential or costly modifications or changes.

The target to be sputtered is composed of several pieces. It has a central part, opposite the substrate, which consists of a material that is more reactive than the part framing or surrounding this center portion. Between the substrate, on the one side, and the multi-piece target, on the other side, there is a diaphragm. It is provided with a central aperture having approximately the configuration of the central target part. Provision is also made for inlets for the reactive gas and the process gas or for one common inlet for both gases. The magnetic field of the cathode is configured such that during the coating, the more reactive target material is sputtered simultaneously or periodically.

Alternatively, the target to be sputtered is composed of several pieces wherein the part of the target that is radially on the outside and opposite the substrate is made of a more reactive material than the part surrounded or framed by this external part. Between the substrate, on the one hand, and the multi-piece target, on the other hand, there is a diaphragm which has approximately the configuration of the central target part. There are individual inlets for both the reactive gas and the process gas or one common inlet for both gases. The magnetic field of the cathode is configured such that during the coating, the more reactive target material is sputtered in the oxidic mode and the less reactive target material in the metallic mode.

The multi-piece target may include a tubular center portion made of a material of a high affinity for the reactive gas, for example Si, and two tubular outer parts which are axially opposite the center part. They are made of a material of a low affinity for the reactive gas, for example Sn.

Another possibility for the particular manufacture of layers of a highly-pure material is to use a target made of one material instead of two different initial materials. However, this accomplishment has zones of various sputtering density where there is an anode running below and parallel to the axial direction of the tubular cathode in a zone of higher sputtering density. The basic surface of this anode is smaller than the projection surface of the cylindrical target, and it can be coated with target material in the oxidic mode. In a zone of lower sputtering density (electrically conductive), an oxide layer made of target material is preferably deposited on the substrate to be coated.

It is also conceivable that a flat target is locally made of a material which, as opposed to the remainder of the target, has a lower affinity for oxygen. These local spots are arranged around a main sputtering trench. The diaphragm arrangement is configured such that the material which has a lower affinity for oxygen, e.g. Sn, is predominantly deposited on this diaphragm in the metallic mode and the remaining material, e.g. Si, through the diaphragm aperture, is applied onto the substrate as an oxide, e.g. $SiO_2$.

The present invention concerns processes and apparatus for modifying the properties of thin layers which can be oxidic or metallic.

DETAILED DESCRIPTION OF THE PREFERRED EMBODIMENT

Figure 1:
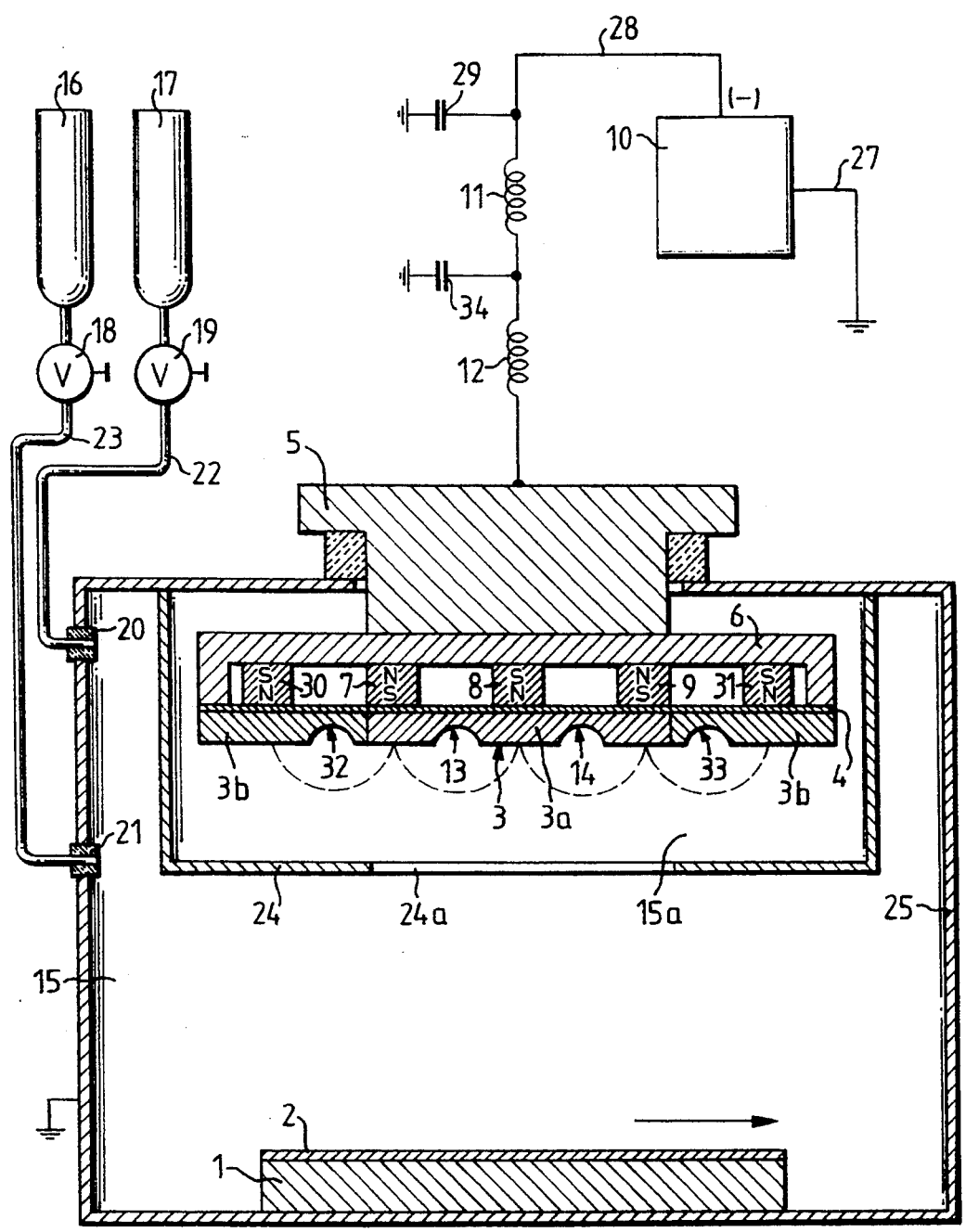
FIG. 1 is a sectional view of a magnetron sputtering apparatus with a target having a center portion with high affinity for reactive gas.

FIG. 1 shows a substrate 1 to be coated with a thin layer 2 made of an oxide (e.g. silicon dioxide or aluminum oxide). Opposite this substrate, there is a multi-piece target 3 to be sputtered. A plate 4 connects the target 3 to an electrode 5 which rests on yoke 6 which in turn encloses five magnets 7, 8, 9, 30, 31 between itself and element 4.

The polarities of the poles of the five magnets directed onto the target 3 alternate such that the south poles of the two outer magnets 30, 31 together with the north poles of the inner magnets 7, 9 form magnetic fields of an approximate circular arc profile across the target 3.

These magnetic fields condense the plasma in front of the target 3 such that the magnetic fields have their highest density at the maximum of their circular arcs. The ions in the plasma are accelerated by an electrical field which is produced due to a direct voltage generated by a direct voltage source 10. The negative pole of this direct voltage source 10 is connected to the electrode 5. The electrical field stands vertically on the surface of target 3 and accelerates the positive ions of the plasma in direction toward this target 3. A more or less large amount of atoms and particles is thus ejected from target 3 especially in the areas 13, 14, 32, and 33. The sputtered atoms and particles travel predominantly in direction toward the substrate 1 where they are deposited as a thin layer 2.

Target 3 includes a center part 3a made of a material having a high affinity for the reactive gas, for example Si, and a frame-like part 3b made of a material having a lower affinity for the reactive gas, for example Sn.

During the sputtering process, this configuration and material selection and the corresponding magnetic fields and the selected ratio of oxygen to argon ensure that Sn is predominantly deposited at the diaphragm 24 as an electrically conductive material whereas the layer 2 on substrate 1 consists predominantly of pure $SiO_2$ (silicon dioxide).

The represented arrangement is controlled by a process computer which processes and releases control commands. This process computer can be fed, for example, the values of the partial pressure measured in process chamber 15, 15a. This and other data allow controlling the gas flow from containers 16, 17 via valves 18, 19 and adjusting the voltage at cathode 5. The process computer is also capable of controlling all other variables, e.g. the cathode current. Since process computers of this kind are known, a description of their design is omitted here.

The predominantly metallic (and hence electrically conductive) layer that is applied during the coating process in the vicinity of the cathode 5, especially at the inside of diaphragm 24, serves the purpose of removing all charge carriers from the vacuum or sputtering chamber 25, thus producing a stable sputtering process.

Figure 1A:
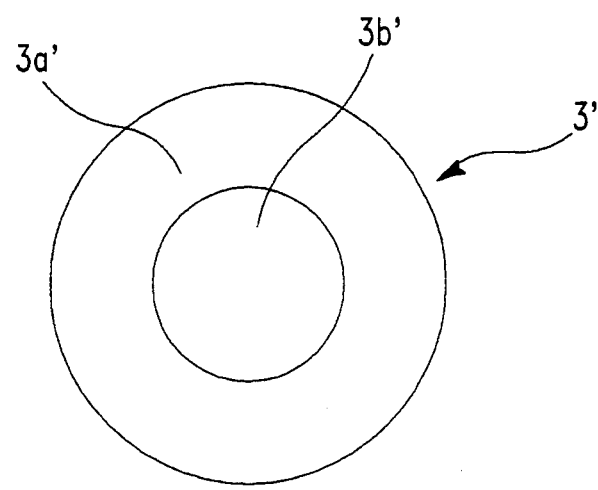
FIG. 1a is a plan view of an alternative target having an outer portion with high affinity for the reactive gas.
Figure 1B:
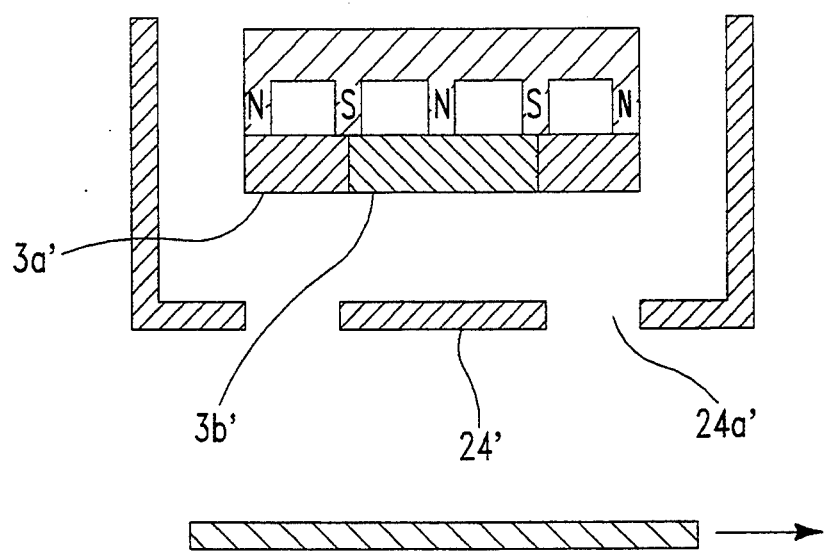
FIG. 1b is a section view of the target of FIG. 1a and a suitable diaphragm for use in the apparatus of FIG. 1.

FIGS. 1a and 1b show a target 3' having an inner portion 3b' of a material such as Sn having low affinity for the reactive gas and an annular outer portion 3a' of a material such as Si having a higher affinity for the reactive gas. This operates on the same principal as the apparatus shown in FIG. 1, but requires a diaphragm 24' having an annular aperture 24a' which permits depositing the reacted 3a' material such as $SiO_2$ on the substrate.

Figure 2:
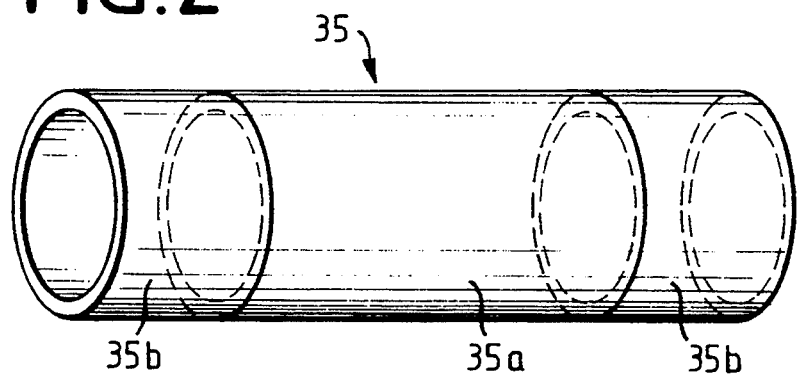
FIG. 2 is a perspective view of a tubular target made of two different metals.

FIG. 2 shows tubular target 35 representing a special embodiment of the multi-piece target 3 diagrammatically represented in FIG. 1. Target 35 is divided in three areas; a center part 35a made of a material having a high affinity for the reactive gas, for example Si, and two parts 35b proceeding from the front sides of the center portion 35a in axial direction and made of a material having a low affinity for the reactive gas, for example Sn.

The reaction of the material from the center part 35a with the reactive gas (for example $O_2$) yields a reaction product, for example $SiO_2$, in the main sputtering zone which corresponds to the center part 35a. If the material for both parts 35b has a sufficiently low affinity for the reactive gas, then for the amount of reactive gas that is just sufficient for the reaction of the materials from the center portion 35a, no reaction occurs between the material of the two outer areas 35b and the reactive gas. This means the parts in the vicinity of the end zones 35a and 35b of target 35 retain their conductivity. In this regard, Sn and Si are suitable materials for the respective outer and inner portions of the target.

Figure 2A:
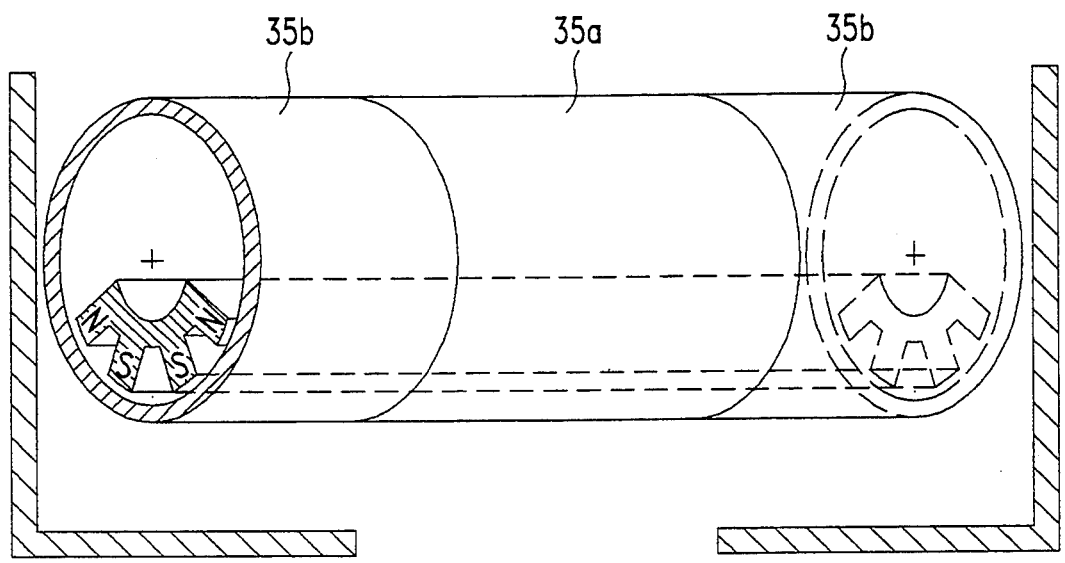
FIG. 2a is a partial schematic perspective of the target of FIG. 2 with a suitable magnet system and diaphragm.
Figure 2B:
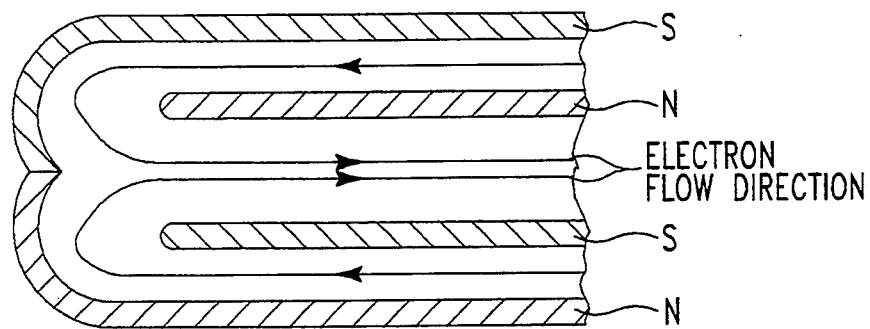
FIG. 2b is a sectional view of the magnet arrangement shown partially in FIG. 2a, FIG. 3 is a sectional view of a magnet arrangement for a tubular cathode.

FIGS. 2a and 2b show the magnet arrangement and diaphragm suitable for use with the tubular target of FIG. 2. The apparatus is otherwise similar to FIG. 1 with brushes or the like being used for contact with the cathode. The alternative target configuration of FIGS. 1a and 1b is also applicable for the tubular target of FIGS. 2 and 2a. That is, the central portion 35a could be the less reactive material such as Sn. The diaphragm would then have a central blind for metal deposition opposite portion 35a, and apertures opposite the reactive portions 35b.

Figure 3:
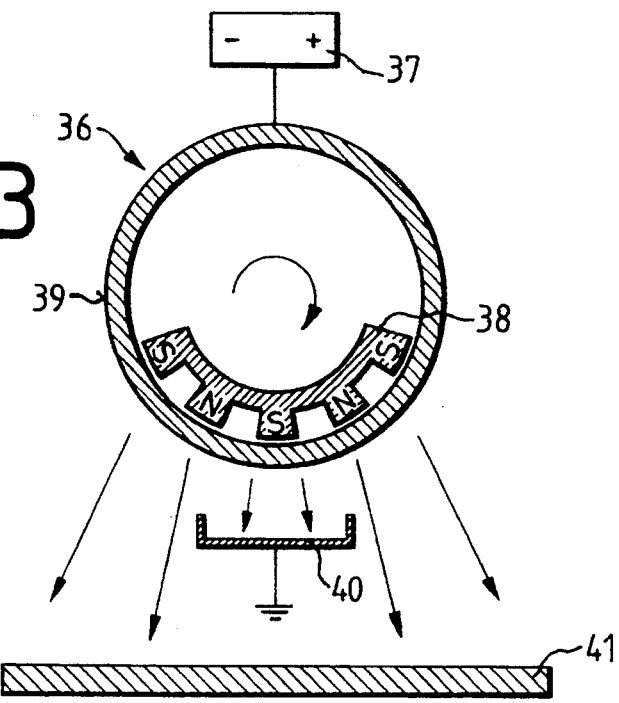

FIG. 3 is a cross section of a hollow cylindrical tubular cathode 36 which can be rotated around its longitudinal axis. On one side it is connected to a voltage supply 37 and, on the other side, it has a circular arc-like stationary arrangement of pairs of magnets 38 on its inside. The entire outer surface of cathode 36 is provided with a target material 39 to be sputtered, for example Si. Since the electrical power densities on the target 39 will vary locally while using the same target material and reactive gas, there will also be locally differentiated deposits of, for example, $SiO_2$ and Si. Si is preferably deposited on a stationary surface which serves as a permanently conductive anode 40 whereas $SiO_2$ is preferably deposited on a substrate 41 to be coated.

Figure 4:
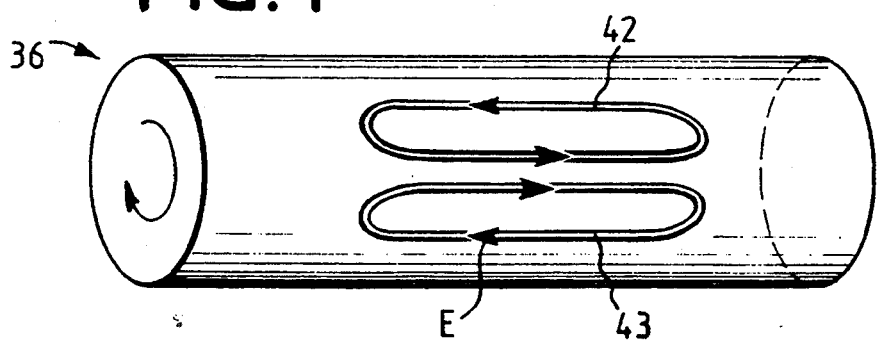
FIG. 4 is a perspective view of a tubular cathode according to FIG. 3.

FIG. 4 is a perspective view of the rotating tubular cathode 36 of FIG. 3 viewed from the side of anode 40. The two sputtering trenches 42 and 43, in the form of-so called "race tracks" have coupled magnetic tunnels, each being in balance on the center track (cf. direction E of electron flow). This is also where the higher power density occurs.

Figure 5:
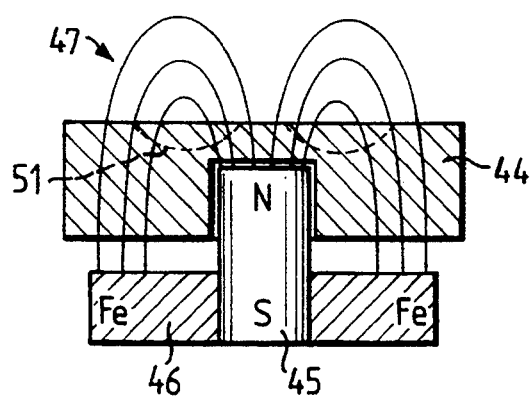
FIG. 5 is a sectional view of a magnet arrangement for secondary trenches.

A magnet arrangement for a secondary sputtering trench according to FIG. 5 includes a discoidal part of a target 44 with a bore centrically provided on the bottom. This bore serves to receive a cylindrical magnet 45. The end of magnet 45 protruding from the target disk 44 has a discoidal yoke 46 from which the magnetic flux lines 47 extend to the north pole of magnet 45.

Figure 6:
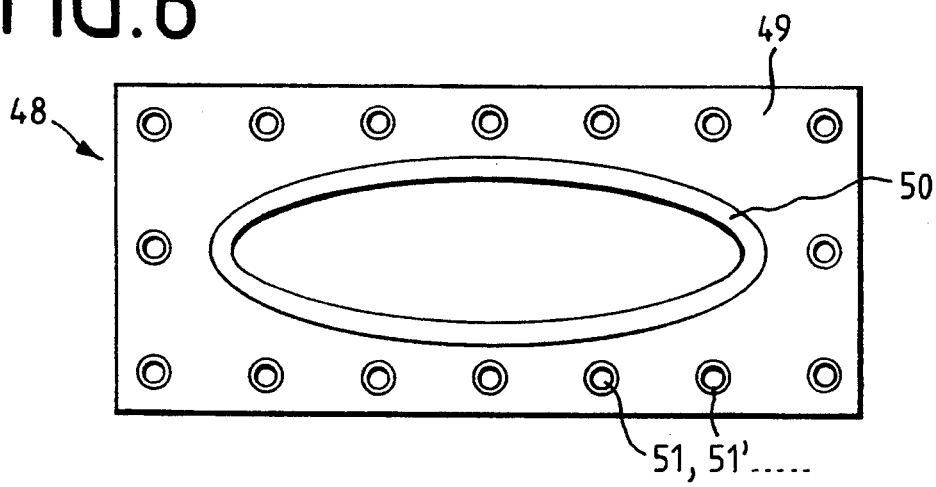
FIG. 6 is a top view of a cathode with one primary and several secondary trenches according to FIG. 5.

A parallelpiped cathode 48 as seen in FIG. 6 includes a target material 49 in which the "racetrack" main sputtering trench 50 is formed and, further, has a plurality of smaller areas 44 made of a second material in which the secondary trenches 51 are formed as already seen in FIG. 5. They are provided around the main trench 50 in the surface of target 49 with the target areas 44 being made of a material having less affinity for the reactive gas than target 49.

The target of FIG. 6 must therefore be used with a diaphragm having a central aperture opposite the main sputtering trench 50 and a shield opposite the secondary trenches 51.

Figure 7:
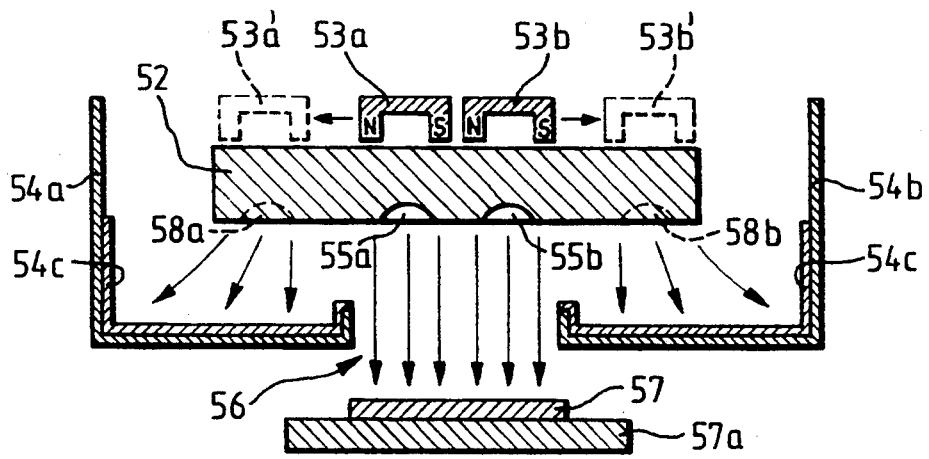
FIG. 7 is a sectional view of an arrangement for a sputtering cathode with movable magnets.

FIG. 7 shows a planar target 52 of a uniform material, the magnets 53a, 53b being movably disposed on the side of the target which faces away from the substrate. Diaphragms 54a and 54b, acting as anodes, are arranged between target 52 and substrate 57a so that they leave free the center area between target 52 and substrate 57a. Under the same operating conditions, the sputtering trenches 55a and 55b will be formed on the side of target 52 which is opposite the magnets 53a, 53b. The addition of a reactive gas results in a complete oxidation of the sputtering product which is then deposited underneath the diaphragm aperture 56 as layer 57 on substrate 57a.

During pulsed operation, the magnets 53a, 53b are shifted toward the outside into positions 53a', 53b' opposite the portions of diaphragms 54a, 54b that extends parallel to the main direction of extension, whereby additional sputtering trenches 58a and 58b will be formed. An increase in the electrical sputtering power or a reduction of the amount of reactive gas supplied or a simultaneous application of both measures produces a metallic sputtering product which is deposited as layer 54c on the inner sides of the surrounding diaphragms 54a and 54b thus ensuring their function as electrically conductive anodes.

Movable permanent magnets 53a, 53b can be partially or completely replaced by controlled electromagnets or controlled coils which substantially facilitate practical application.

What is claimed is:

1. Apparatus for the reactive coating of a substrate comprising
   an evacuable coating chamber,
   means for introducing a process gas into said chamber,
   means for introducing a reactive gas into said chamber,
   a cathode,
   a power source connected to said cathode,
   a plurality of magnets adjacent said cathode,
   a target comprising a center part and at least one outer part outside of said center part, one of said center part and said at least one outer part comprising a first material having substantially higher affinity for said reactive gas than the other part, the other part being made of a second material, said target being situated in said coating chamber so that said cathode accelerates ionized process gas toward said target, and
   a diaphragm between said target and said substrate to be coated, said diaphragm having aperture means configured and aligned so that the part of the target having higher affinity for the reactive gas provides most of the reactive coating for the substrate.

2. Apparatus as in claim 1 wherein said center part is made of said first material having said high affinity for said reactive gas, said diaphragm having a central aperture aligned with said center part.

3. Apparatus as in claim 2 wherein said at least one outer part comprises a plurality of areas of said second material situated outside of said center part.

4. Apparatus as in claim 1 wherein said center part is made of said second material, said aperture means being opposite said at least one outer part.

5. Apparatus as in claim 1 wherein said center part is substantially circular and said outer part is annular.

6. Apparatus as in claim 1 wherein said target is substantially tubular, said center part being tubular and having opposed ends, said at least one outer part comprising a pair of tubular outer parts at respective said opposed ends of said center part.

7. Apparatus as in claim 6 wherein said tubular center part is made of said first material and said tubular outer parts are made of said second material, said diaphragm comprising a central aperture aligned with said center part.

8. Apparatus as in claim 7 wherein said target is rotatable about its tubular axis.

9. Apparatus as in claim 1 wherein said first material is silicon, whereby silicon oxide can be deposited on said substrate when said reactive gas is oxygen.

10. Apparatus as in claim 1 wherein said second material is tin, whereby tin may be deposited on said diaphragm.

11. Process for reactively coating a substrate using a magnetron sputtering apparatus of the type comprising
    an evacuable coating chamber, respective means for introducing a process gas and a reactive gas into said chamber, a cathode which interacts with a metallic target to be sputtered, a power supply connected to said cathode, a plurality of magnets behind said target opposite said substrate, and a diaphragm anode between said target and said substrate, said diaphragm having aperture means between part of said target and said substrate to be coated, said process comprising the steps of
    positioning said magnets a distance behind said target so that the part of the target adjacent said aperture means is sputtered,
    controlling the power to the cathode and the supply of reactive gas so that said substrate is reactively coated,
    repositioning said magnets a like distance behind said target so that the parts of the target which are not adjacent said aperture means are sputtered, and
    controlling the power to the cathode and the supply of reactive gas so that said diaphragm is metallically coated.

12. Apparatus for reactive coating of a substrate comprising
    an evacuable coating chamber,
    means for introducing a process gas into said chamber,
    a tubular cathode having an axis and an outer cylindrical surface with a first zone closest to said substrate and a second zone outside of said first zone, said outer cylindrical surface being substantially parallel to said axis,
    a power source connected to said cathode,
    a plurality of magnets situated inside said tubular cathode,
    a target of a single metallic material in the form of a metallic coating on said outer cylindrical surface of said tubular cathode, and
    an anode between said cathode and said substrate and aligned with said first zone so that said first zone has a higher sputtering power density than said second zone, whereby
    during reactive sputtering, said anode can be coated by target material in a metallic mode from said first zone and said substrate can be coated with reacted target material from said second zone.

13. Apparatus as in claim 12 wherein said cathode is rotatable about its tubular axis.

* * * * *